United States Patent
Sugimoto et al.

(10) Patent No.: US 6,954,079 B2
(45) Date of Patent: Oct. 11, 2005

(54) INTERFACE CIRCUIT COUPLING SEMICONDUCTOR TEST APPARATUS WITH TESTED SEMICONDUCTOR DEVICE

(75) Inventors: Masaru Sugimoto, Hyogo (JP); Teruhiko Funakura, Hyogo (JP); Hidekazu Nagasawa, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 21 days.

(21) Appl. No.: 10/462,743

(22) Filed: Jun. 17, 2003

(65) Prior Publication Data
US 2004/0113642 A1 Jun. 17, 2004

(30) Foreign Application Priority Data
Dec. 17, 2002 (JP) ........................ 2002-365311

(51) Int. Cl.⁷ ............................................. G01R 31/26
(52) U.S. Cl. ........................................ 324/763; 324/765
(58) Field of Search .................... 324/73.1, 754, 324/763–765; 714/700, 724, 736; 702/118–119, 125

(56) References Cited

U.S. PATENT DOCUMENTS

| | | | | |
|---|---|---|---|---|
| 3,772,595 A | * | 11/1973 | De Wolf et al. | ............ 714/736 |
| RE31,056 E | * | 10/1982 | Chau et al. | ................ 324/73.1 |
| 5,604,679 A | * | 2/1997 | Slater | ......................... 702/125 |
| 5,794,175 A | * | 8/1998 | Conner | ....................... 702/119 |
| 6,339,338 B1 | * | 1/2002 | Eldridge et al. | ............ 324/765 |
| 6,493,840 B1 | * | 12/2002 | Shacham et al. | ........... 714/724 |
| 6,499,121 B1 | * | 12/2002 | Roy et al. | .................... 714/724 |
| 6,753,693 B2 | * | 6/2004 | Seo et al. | .................... 324/765 |

FOREIGN PATENT DOCUMENTS

| JP | 2002-5999 A | 1/2002 |
|---|---|---|
| JP | 2002-107406 A | 4/2002 |
| JP | 2002-189058 A | 7/2002 |

* cited by examiner

Primary Examiner—Minh N. Tang
(74) Attorney, Agent, or Firm—McDermott Will & Emery LLP

(57) ABSTRACT

The interface circuit includes n buffer circuits, switches for connecting an external pin of a tester to input nodes of n buffer circuits and connecting output nodes of n buffers respectively to n DUTs when a signal is provided from the tester to n DUTs, and successively connecting n DUTs to the external pin of the tester by a prescribed time period when voltage-ampere characteristics of n DUTs are measured. Therefore the number of devices that can be measured by the tester at a time can be increased by n times. As a result, the test cost can be reduced and the test accuracy can be improved.

17 Claims, 15 Drawing Sheets

INTERFACE CIRCUIT COUPLING SEMICONDUCTOR TEST APPARATUS WITH TESTED SEMICONDUCTOR DEVICE

BACKGROUND OF THE INVENTION

1. Field of the Invention

The present invention relates to an interface circuit, and more particularly to an interface circuit coupling a semiconductor test apparatus with a tested semiconductor device.

2. Description of the Background Art

Conventionally, in the field of semiconductor integrated circuit devices (referred to as LSI hereinafter), a test is performed before shipment to determine whether or not each LSI is normal and only a normal LSI is shipped. In this test, a plurality of LSIs are connected to one semiconductor test apparatus (referred to as a tester hereinafter). Usually, one external terminal of LSI is connected to one external pin of the tester, and a signal is applied, for example, from the external pin of the tester to the external terminal of LSI.

In order to reduce the test cost for LSI, a method of connecting an output pin of a tester to a plurality of LSIs in parallel has been proposed (for example, see Japanese Patent Laying-Open No. 2002-189058).

With only parallel connection of an output pin of a tester with a plurality of LSIs, a mismatch of an output impedance of the tester may be caused to deteriorate a waveform quality of the output signal or an output current of the tester may not be distributed evenly to a plurality of LSIs, thereby preventing an accurate test.

Recently, with the advancement of the process technology, low power supply voltage type of LSIs are increased in number in addition to conventional high power supply voltage type of LSIs. However, the low power supply voltage type of LSI cannot be tested with the tester that has tested the high power supply voltage type of LSI, because the resolution of the output voltage is coarse. Therefore, a tester having a high voltage-accuracy is separately needed, thereby increasing the test cost.

In addition, with the lower consumption of LSI, the output current of LSI is reduced and the output impedance of LSI is increased. Therefore, because of a mismatch between an impedance of an external pin of a commercially available tester (mainly 50 Ω) and an output impedance of LSI (100–300 Ω), the output signal waveform of LSI suffers from the effect of reflection. This effect prevents an accurate measurement by the tester.

SUMMARY OF THE INVENTION

A main object of the present invention is therefore to provide an interface circuit where a test cost can be reduced and test accuracy can be improved.

An interface circuit includes a plurality of buffer circuits provided respectively corresponding to a plurality of tested semiconductor devices and having their input nodes connected to each other, each transmitting an output signal of the semiconductor test apparatus to a corresponding tested semiconductor device. Therefore the number of devices that can be measured by the semiconductor test apparatus at a time can be increased by multiple times and the test cost can be reduced. Furthermore, since each of a plurality of distributing paths is provided with a buffer, the same current and a signal of the same waveform can be applied to a plurality of tested semiconductor devices and a test can be performed accurately.

Another interface circuit in accordance with the present invention includes: a first buffer circuit having its input node receiving an output signal of a semiconductor test apparatus; a load circuit suppressing a reflection of a signal output from a first tested semiconductor device; a first switching circuit having a first switch terminal receiving an output signal of the first buffer circuit, a second switch terminal connected to the first tested semiconductor device and a third switch terminal connected to the load circuit, being rendered conductive between the first and second switch terminals at a first mode in which an output signal of the semiconductor test apparatus is applied to the first tested semiconductor device, and being rendered conductive between the second and third switch terminals at a second mode in which an output signal of the first tested semiconductor device is applied to the semiconductor test apparatus; and a second buffer circuit having its input node connected to the second switch terminal and transmitting an output signal of the first tested semiconductor device to the semiconductor test apparatus at the second mode. Therefore with a shortened distance between the interface circuit and the tested semiconductor device, a length of a portion where a mismatch is caused between the semiconductor test apparatus and the tested semiconductor device can be reduced. As a result, the effect of the signal reflection can be reduced and a test can be performed accurately. Furthermore, the life of the semiconductor test apparatus can be prolonged and the test cost can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
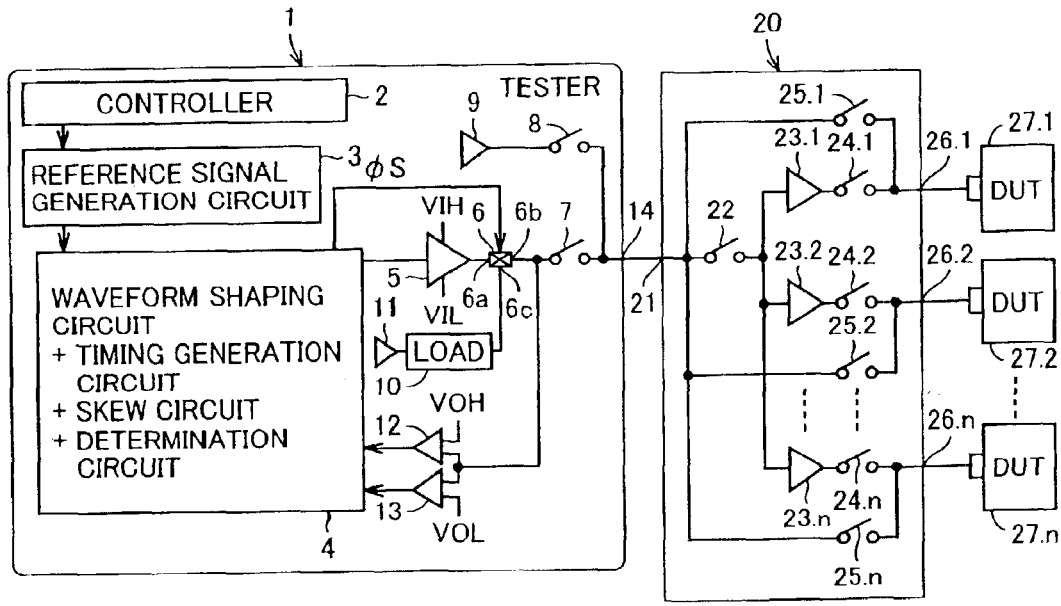
FIG. 1 is a circuit block diagram showing a main part of a semiconductor test system in accordance with a first embodiment of the present invention.

FIG. 1 is a circuit block diagram showing a main part of a semiconductor test system in accordance with a first embodiment of the present invention. In FIG. 1, this semiconductor test system includes a tester 1 and an interface circuit 20. Tester 1 includes a controller 2, a reference signal generation circuit 3, a test circuit 4, an output buffer 5, a fast change-over switch 6, switches 7, 8, a current measuring unit 9, a load circuit (LOAD) 10, a power supply for load circuit 11, comparators 12, 13, and an external pin 14. FIG. 1 only shows one external pin 14 of tester 1 and a part corresponding thereto. Actually, a number of external pins 14 are provided.

Controller 2 outputs a variety of control signals at a prescribed timing and controls the entire tester 1. Reference signal generation circuit 3 is controlled by controller 2 and outputs a reference signal. Test circuit 4 includes a waveform shaping circuit, a timing generation circuit, a skew circuit, and a determination circuit, for outputting a write data signal to a memory portion of LSI and determining whether or not the memory portion of LSI is normal based on a read data signal form the memory portion of LSI.

Fast change-over switch 6 is controlled by a switching signal $\phi S$ from test circuit 4 and includes three switch terminals 6a, 6b, 6c. When a signal is output from tester 1 to a tested semiconductor device (referred to as DUT hereinafter), switch terminals 6a and 6b are electrically connected to each other. When tester 1 receives an output signal of DUT, switch terminals 6b and 6c are electrically connected to each other.

Output buffer 5 transmits an output signal of test circuit 4 to switch terminal 6a of fast change-over switch 6. Switch 7 is connected between switch terminal 6a of fast change-over switch 6 and external pin 14 and is rendered non-conductive when a voltage-ampere characteristic of DUT is measured. Switch 8 is connected between an output terminal of current measuring unit 9 and external pin 14 and is rendered conductive when a voltage-ampere characteristic of DUT is measured. Current measuring unit 9 outputs multiple levels of voltages and detects an output current at the time of output of each voltage to measure the voltage-ampere characteristic of DUT.

Load circuit 10 is connected to switch terminal 6c of fast change-over switch 6 and suppresses the reflection of the output signal of DUT. Power supply for load circuit 11 applies a prescribed power supply voltage to load circuit 10.

Comparator 12 determines whether or not a potential of the output signal of DUT applied through external pin 14 and switch 7 is higher than a prescribed potential VOH, and provides a signal having a level corresponding to a determination result to test circuit 4. Comparator 13 determines whether or not a potential of the output signal of DUT applied through external pin 14 and switch 7 is lower than a prescribed potential VOL (<VOH), and provides a signal having a level corresponding to a determination result to test circuit 4. Test circuit 4 compares the output signals of comparators 12, 13 with an expected value of the output signal of DUT and outputs a signal of a level corresponding to a comparison result.

Interface circuit 20 is a circuit coupling external pin 14 of tester 1 to n DUTs 27.1–27.n (where n is a natural number) and includes an input terminal 21, switches 22, 24.1–4.n, 25.1–5.n, buffers 23.1–3.n, and output terminals 26.1–6.n.

Input terminal 21 is connected to external pin 14 of tester 1, and output terminals 26.1–26.n are connected to prescribed external terminals of DUT 27.1–27.n, respectively. Switch 22 has one electrode connected to input terminal 21 and the other electrode connected to input nodes of buffers 23.1–23.n. Switches 24.1–24.n have one electrodes connected to respective output nodes of buffers 23.1–23.n and the other electrodes connected to respective output terminals 26.1–26.n. Each of switches 22, 24.1–24.n is controlled, for example, by controller 2 of tester 1 and is rendered conductive when the output signal of tester 1 is applied to DUT 27.1–27.n.

Buffers 23.1–3.n amplify and transmit to prescribed external terminals of DUT 27.1–7.n, respectively, the signal provided from tester 1 through input terminal 21 and switch 22. The voltage amplification rate Av of each of buffers 23.1–3.n is controllable at a desired value and is controlled, for example, by controller 2 of tester 1.

Switches 25.1–5.n have one electrodes connected together to input terminal 21 and the other electrodes connected to respective output terminals 26.1–6.n. Each of switches 25.1–5.n is controlled, for example, by controller 2 of tester 1 and is rendered conductive when a voltage-ampere characteristic of a corresponding DUT is measured.

Next, the operation of this semiconductor test system will be described. When a signal is provided from tester 1 to DUT 27.1–7.n, fast change-over switch 6 is rendered conductive between terminals 6a and 6b, switch 7 is rendered conductive, and switch 8 is rendered non-conductive, in tester 1. Furthermore, in interface circuit 20, switches 22, 24.1–4.n are rendered conductive, switches 25.1–5.n are rendered non-conductive, and a voltage-amplification rate Av of each of buffers 23.1–3.n is set at a prescribed value.

A signal generated in test circuit 4 of tester 1 is provided through output buffer 5, fast change-over switch 6, switch 7, external pin 14, input terminal 21, and switch 22 to buffers 23.1–3.n. The output signals of buffers 23.1–3.n are provided through switches 24.1–4.n and output terminals 26.1–6.n to prescribed external terminals of DUTs 27.1–7.n. The signal provided to DUTs 27.1–7.n has an amplitude voltage of Vt•Av and a resolution of ΔVt•Av, where the amplitude voltage of the output signal of tester 1 is Vt and the resolution thereof is ΔVt.

When a voltage-ampere characteristic of DUT is measured, in tester 1, switch 7 is rendered non-conductive and switch 8 is rendered conductive. Furthermore, in interface circuit 20, switches 22, 24.1–4.n are rendered non-conductive and one of switches 25.1–5.n (for example 25.1) is rendered conductive. Current measuring unit 9 of tester 1 measures a voltage-ampere characteristic of DUT (in this case 27.1) through switch 8, external pin 14, input terminal 21 and switch 25.1. After completion of measurement of the voltage-ampere characteristic of DUT 27.1, switches 25.2-25.n are successively rendered conductive by a prescribed time period, and the voltage-ampere characteristics of DUTs 27.2-27.n are successively measured one by one.

In the first embodiment, one output signal of tester 1 is amplified by n buffers 23.1–3.n and provided to n DUTs 27.1–7.n. Therefore, the number of output signals of tester 1 is increased by n times and the number of devices that can be measured by the tester at a time is increased, thereby reducing the test cost. Furthermore, since each of n paths is provided with a buffer, the same current can be applied to n DUTs 27.1–7.n, and a signal of the same waveform can be applied to n DUTs 27.1–7.n. As a result, the test can be performed accurately.

Furthermore, since the voltage amplification rate Av of each of buffers 23.1–3.n can be set at a desired value, DUT with a signal of a low amplitude voltage can be tested with Av<1 and DUT with a signal of a high amplitude voltage can also be tested with Av>1. With Av<1, a signal with a small amplitude can be applied to DUT with a resolution smaller than a resolution of tester 1 and thus DUT that cannot be tested by tester 1 can be tested. On the other hand, with Av>1, a signal with an amplitude voltage higher than an output amplitude voltage of tester 1 can be applied to DUT and thus DUT that cannot be tested by tester 1 can be tested. Therefore the life of tester 1 can be prolonged and an introduction of a new tester can be prevented, thereby reducing the test cost.

Furthermore, by providing switches 22, 24.1–4.n for isolating buffers 23.1–3.n from input terminal 21 and output terminals 26.1–6.n and switches 25.1–5.n for selectively connecting one of n output terminals 26.1–6.n with input terminal 21, the voltage-ampere characteristics of DUTs 27.1–7.n can be measured one by one.

It is noted actually tester 1 includes a plurality of external pins 14 and interface circuit 20 includes plural sets of switches 22, 24.1–4.n, 25.1–5.n and buffers 23.1–3.n. Interface circuit 20 may be formed on one semiconductor substrate (chip) or may be mounted on a normal insulating substrate (a substrate for testing a device, a probe card, a substrate within a tester, or the like). Alternatively, interface circuit 20 may be provided within tester 1. Furthermore, a plurality of DUTs may be mounted on one test substrate and interface circuit 20 may also be mounted on the test substrate.

[Second Embodiment]

Figure 2:
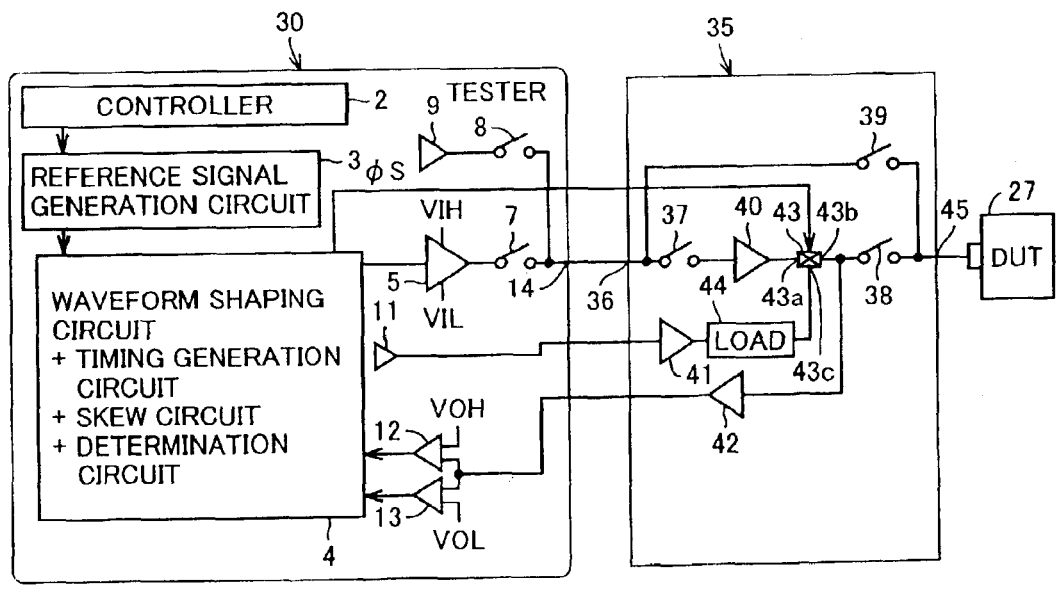
FIG. 2 is a circuit block diagram showing a main part of a semiconductor test system in accordance with a second embodiment of the present invention.

FIG. 2 is a circuit block diagram showing a main part of a semiconductor test system in accordance with a second embodiment of the present invention. In FIG. 2, this semiconductor test system includes a tester 30 and an interface circuit 35. Tester 30 is formed by removing fast change-over switch 6 and load circuit 10 from tester 1 in FIG. 1. The output node of output buffer 5 directly provides switching signal φS generated in test circuit 4 to the external pin 14 through switch 7, for interface circuit 35. Power supply for load circuit 11 and comparators 12, 13 are directly connected to interface circuit 35. FIG. 2 only shows one external pin 14 of tester 30 and a part corresponding thereto. Actually, a plurality of external pins 14 are provided.

Interface circuit 35 includes an input terminal 36, switches 37–39, buffers 40–42, a fast change-over switch 43, a load circuit 44, and a signal input/output terminal 45. Input terminal 36 is connected to external pin 14 of tester 30 and signal input/output terminal 45 is connected to one data signal input/output terminal of DUT 27.

Fast change-over switch 43 is controlled by switching signal φS from test circuit 4 of tester 30 and includes three switch terminals 43a–43c. When a data signal is output from tester 30 to DUT 27, terminals 43a and 43b are electrically connected to each other, and when tester 30 receives an output signal of DUT, switch terminals 43b and 43c are electrically connected to each other.

Switch 37 is connected between input terminal 36 and the input node of buffer 40. Buffer 40 amplifies and provides to switch terminal 43a of fast change-over switch 43 a signal provided from tester 30 through input terminal 36 and switch 37. Switch 38 is connected between switch terminal 43b of fast change-over switch and signal input/output terminal 45. Switches 37, 38 are controlled, for example, by controller 2 of tester 30 and are rendered non-conductive when the voltage-ampere characteristic of DUT 27 is measured.

Switch 39 is connected between input terminal 36 and signal input/output terminal 45, is controlled, for example, by controller 2 of tester 30, and is rendered conductive when a voltage-ampere characteristic of DUT 27 is measured. Load circuit 44 is connected to switch terminal 43c of fast change-over switch 43 and suppresses a reflection of the output signal of DUT 27. Buffer 41 amplifies and provides to load circuit 44 a power supply voltage for load circuit output from power supply for load circuit 11. Buffer 42 amplifies and provides to the input nodes of comparators 12, 13 of tester 30 a data signal provided from DUT 27 through signal input/output terminal 45 and switch 38. The output impedance of buffer 42 is set to match the impedance of the signal path between buffer 42 and comparators 12, 13. The voltage-amplification rates Ava, Avb, Avc of buffers 40, 41, 42 are controllable at desired values and are controlled, for example, by controller 2 of tester 30.

The operation of this semiconductor test system will now be described. When a signal is applied from tester 30 to DUT 27, switch 7 is rendered conductive and switch 8 is rendered non-conductive in tester 30. Furthermore, in interface circuit 35, switch 39 is rendered non-conductive, switches 37, 38 are rendered conductive, fast change-over switch 43 is rendered conductive between switch terminals 43a and 43b, and the voltage amplification rate Ava of buffer 40 is set at a prescribed value.

A signal generated in test circuit 4 in tester 30 is applied through output buffer 5, switch 7, external pin 14, input terminal 36, switch 37, buffer 40, fast change-over switch 43, switch 38, and signal input/output terminal 45 to the data input/output terminal of DUT 27. The signal provided to DUT 27 has an amplitude voltage of Vta•Ava and a resolution of ΔVta•Vva, where the amplitude voltage of the output signal of tester 30 is Vta and the resolution thereof is ΔVta.

When the voltage-ampere characteristic of DUT 27 is measured, in tester 30, switch 7 is rendered non-conductive and switch 8 is rendered conductive. Furthermore, in interface circuit 35, switches 37, 38 are rendered non-conductive and switch 39 is rendered conductive. Current measuring unit 9 of tester 30 measures the voltage-ampere characteristic of DUT 27 through switch 8, external pin 14, input terminal 36, switch 39, and signal input/output terminal 45.

When tester 30 receives the output signal of DUT 27, switches 7, 8 are rendered non-conductive in tester 30. Furthermore, in interface circuit 35, switches 37, 39 are rendered non-conductive, switch 38 is rendered conductive, fast change-over switch 43 is rendered conductive between switch terminals 43b and 43c, and each of voltage amplification rates Avb, Avc of buffers 41, 42 is set at a prescribed value. The output voltage of buffer 41 is Vtb•Avb where the output voltage of power supply for load circuit 11 is Vtb. The amplitude voltage of the output signal of buffer 42 is Vtc•Avc where the amplitude voltage of the output signal of DUT 27 is Vtc.

The output data signal of DUT 27 is input through signal input/output terminal 45, switch 38, and buffer 42 to comparators 12, 13. Test circuit 4 determines a logic level of a read data signal of DUT 27 based on the output signals of comparators 12, 13, to determine that the address from which that data signal is read is normal when the determined logic level matches the expected value and to determine that the address from which that data signal is read is faulty when the determined logic level does not match the expected value. At this point, load circuit 44 suppresses a reflection of the data signal.

Figure 3A:
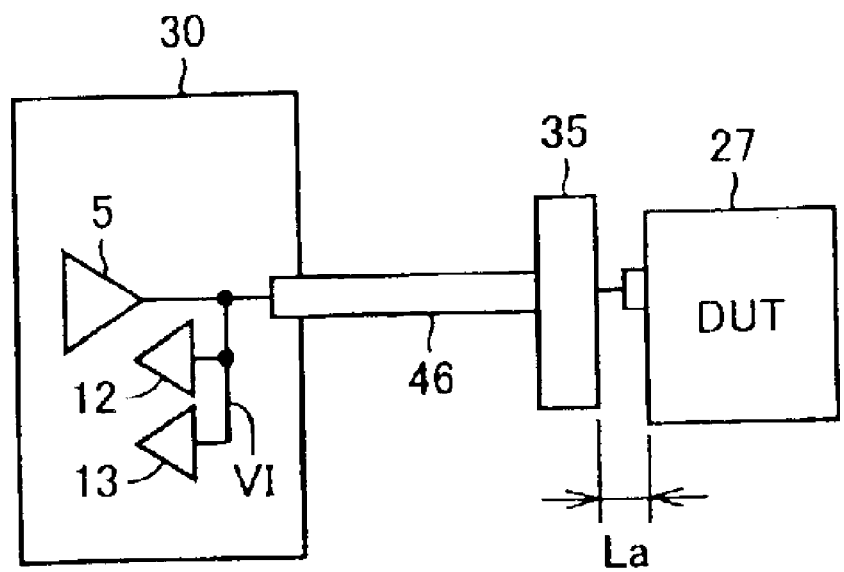
FIGS. 3A and 3B are diagrams illustrating the effect of the semiconductor test system shown in FIG. 2.
Figure 3B:
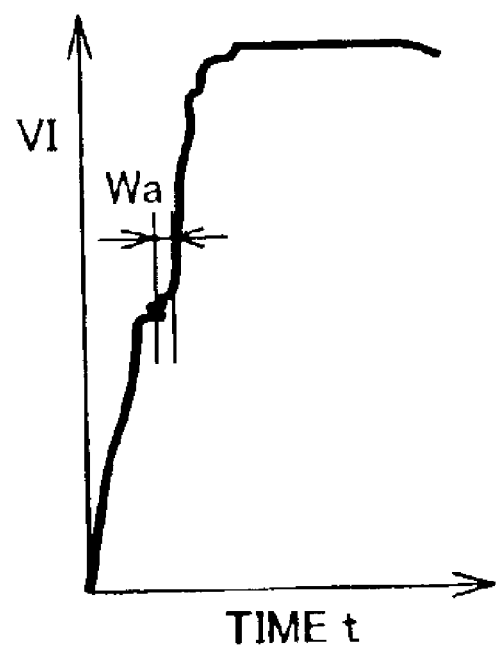
Figure 4A:
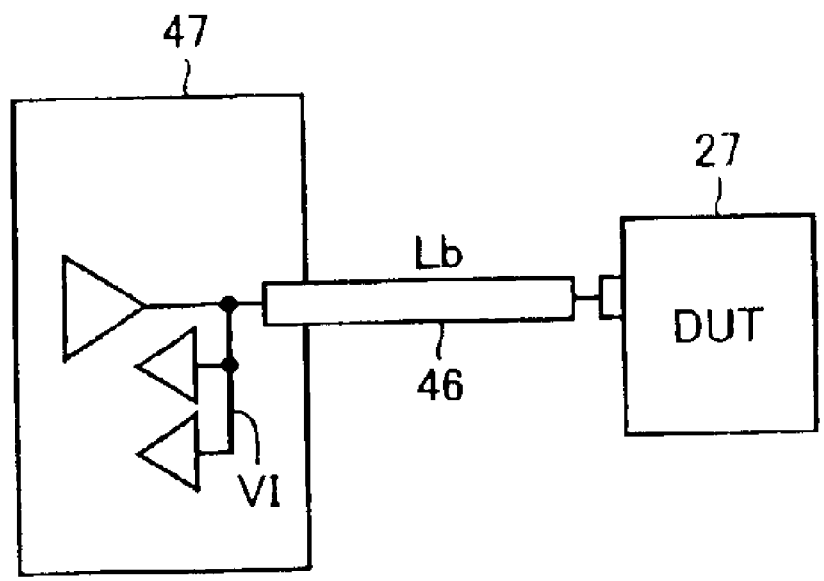
FIGS. 4A and 4B are other diagrams illustrating the effect of the semiconductor test system shown in FIG. 2.
Figure 4B:
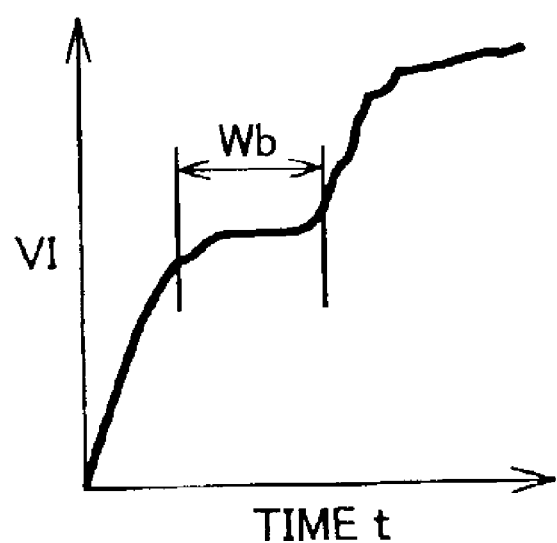

FIGS. 3A and 3B are diagrams showing the effect of the second embodiment. In FIGS. 3A and 3B, in the second embodiment, the output impedance of buffer 42 of interface circuit 35 is matched with the impedance of signal path 46, so that, by providing interface circuit 35 in the vicinity of DUT 27, an electrical length La between DUT 27 and tester 30 is shortened. If the output impedance of DUT 27 is mismatched with the impedance of signal path 46, a step resulting from a signal reflection occurs in the waveform of input signal VI to comparators 12, 13 of tester 30. In the second embodiment, however, a length La of a part causing a mismatch in signal path 46 is reduced, so that the effect of the signal reflection is reduced and a width Wa of the step is reduced. On the other hand, conventionally, an electrical length Lb between DUT 27 and tester 47 is increased, the effect of the signal reflection is increased, and a width Wb of the step is increased, as shown in FIGS. 4A and 4B.

Furthermore, since the path of the output signal of output buffer 5 is separated from the path of the output signal of buffer 42, a region through which both of the output signal of tester 30 and the output signal of DUT 27 are passed is decreased in length. Therefore a determination inhibiting period of time is shortened in a switching period between an output mode and a determination mode of tester 30.

In addition, since each of the voltage amplification rates Ava, Avc of buffers 40, 42 can be set at a desired value, a DUT 27 with a signal of a small amplitude voltage can be tested with Ava<1.0<Avc and a DUT 27 with a signal of a high amplitude voltage can be tested with Ava>1.0>Avc. With Ava<1.0<Avc, a signal of a small amplitude can be applied to DUT 27 with a resolution smaller than a resolution of tester 30, the output signal of DUT 27 can be determined at the determination level of tester 30, and a DUT 27 that cannot be tested by tester 30 can be tested. With Ava>1.0>Avc, a signal of an amplitude voltage higher than the output amplitude voltage of tester 30 can be applied to DUT 27, the amplitude voltage of the output signal of DUT 27 can be reduced to a level small enough to be determined by tester 30, and a DUT 27 that cannot be tested by tester 30 can be tested. Therefore, the life of tester 30 can be prolonged and an introduction of a new tester is prevented, thereby reducing the test cost.

It is noted that actually tester 30 includes a plurality of external pins 14, and interface circuit 35 includes plural sets of switches 37-39, buffers 40-42, fast change-over switch 43 and load circuit 44. Interface circuit 35 may be formed on one semiconductor substrate (chip) or may be mounted on a normal insulating substrate (a substrate for testing a device, a probe card, a substrate within a tester, or the like). Alternatively, interface circuit 35 may be provided within tester 30. Furthermore, a plurality of DUTs may be mounted on one test substrate with interface circuit 35 mounted on a test substrate.

[First Modification]

Figure 5:
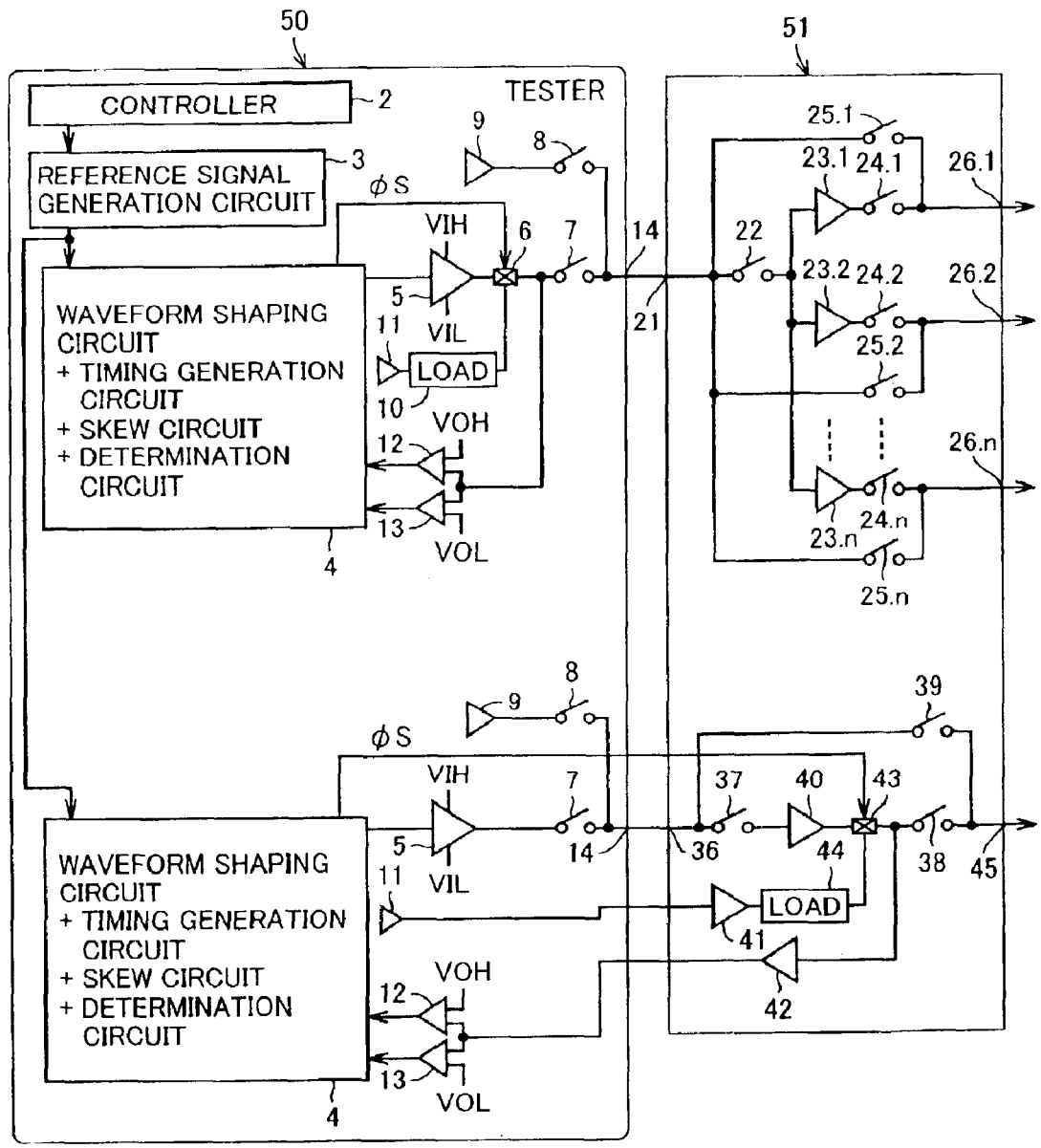
FIG. 5 is a circuit block diagram showing a modification of the second embodiment.

In the following, a variety of modifications will be described. The semiconductor test system in FIG. 5 includes a tester 50 and an interface circuit 51. Tester 50 is formed by combining tester 1 in FIG. 1 with tester 30 in FIG. 2. Interface circuit 51 is formed by combining interface circuit 20 in FIG. 1 with interface circuit 35 in FIG. 2. In the first modification, the effects in both the first and second embodiments can result.

[Second Modification]

Figure 6:
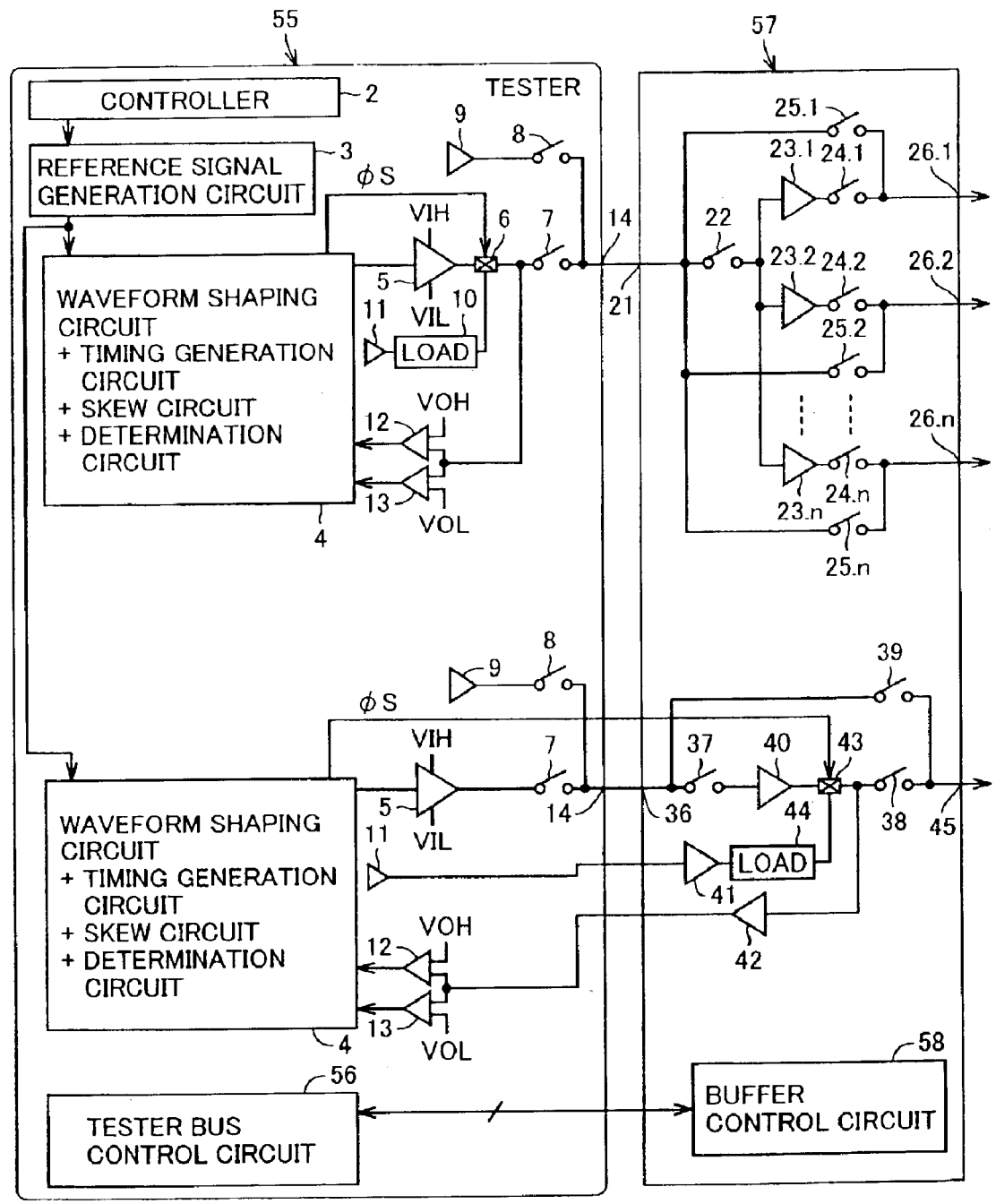
FIG. 6 is a circuit block diagram showing another modification of the second embodiment.

The semiconductor test system in FIG. 6 includes a tester 55 and an interface circuit 57. Tester 55 is formed by adding a tester bus control circuit 56 to tester 50 in FIG. 5. Interface circuit 57 is formed by adding a buffer control circuit 58 to interface circuit 51 in FIG. 5. Tester bus control circuit 56 and buffer control circuit 58 set the voltage amplification rates of buffers 23.1–3.n, 41-43 of interface circuit 57 at desired values, separately, in accordance with a control signal from controller 2. Therefore a voltage amplification rate of each of buffers 23.1–3.n, 41-43 can be changed to a desired value depending on a test item within a sequence of a test program.

[Third Modification]

Figure 7:
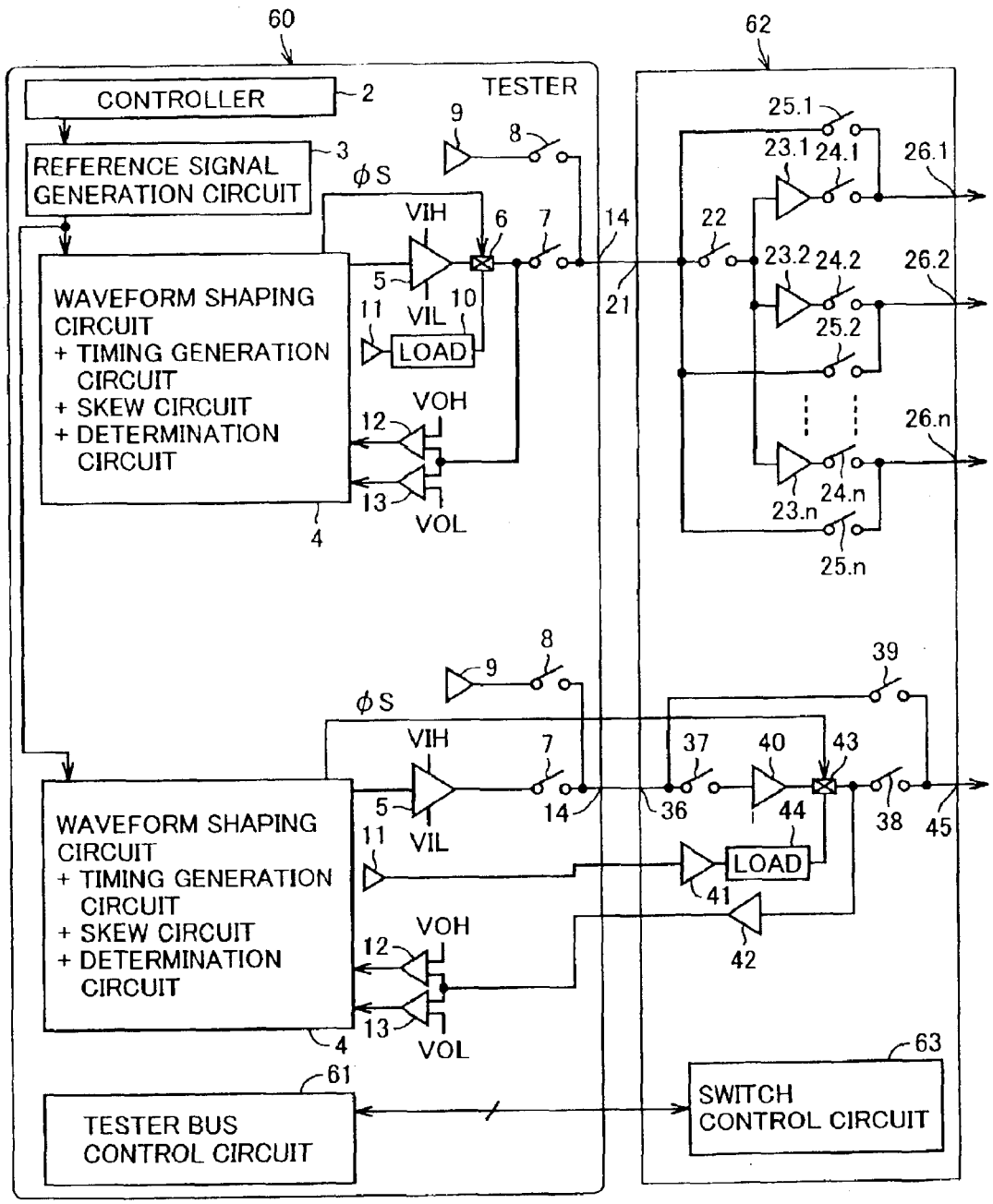
FIG. 7 is a circuit block diagram showing yet another modification of the second embodiment.
Figure 8:
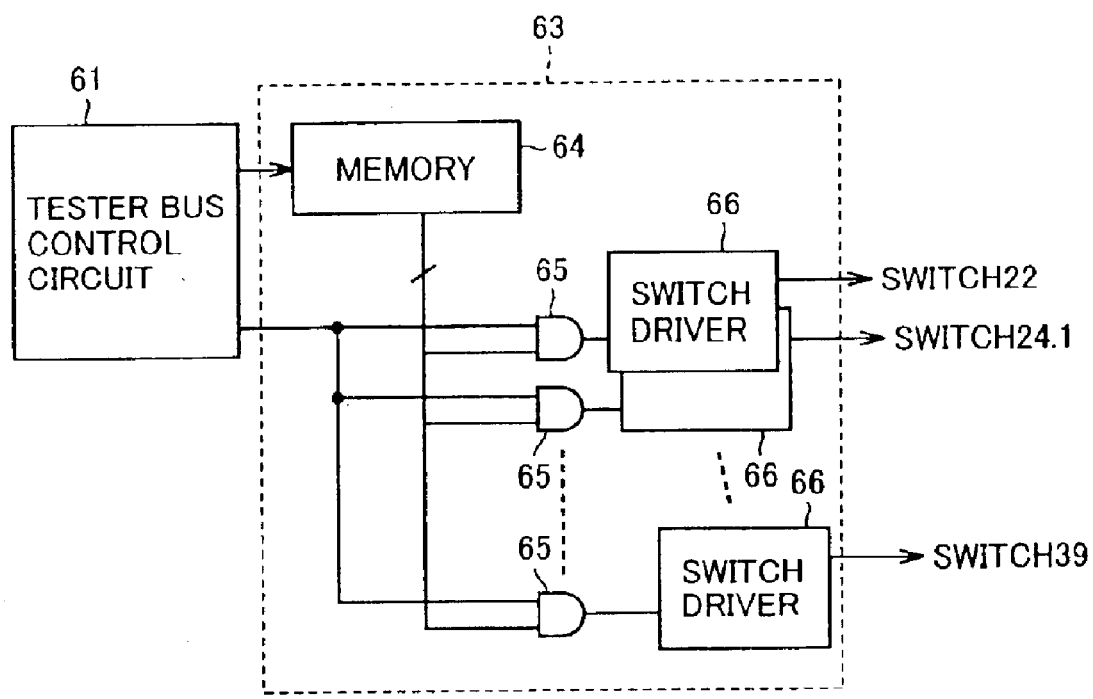
FIG. 8 is a circuit block diagram showing a configuration of a switch control circuit shown in FIG. 7.

The semiconductor test system in FIG. 7 includes a tester 60 and an interface circuit 62. Tester 60 is formed by adding a tester bus control circuit 61 to tester 50 in FIG. 5. Interface circuit 62 is formed by adding a switch control circuit 63 to interface 51 in FIG. 5. Switch control circuit 63 includes a memory 64, and an AND gate 65 and a switch driver 66 provided corresponding to each switch, as shown in FIG. 8. Switches 22, 24.1–4.n, 25.1–5.n, 37–39 are divided into a plurality of groups in advance. Memory 64 stores which group of a plurality of groups each of switches 22, 24.1–4.n, 25.1–5.n, 37–39 belongs to.

Switches 22, 24.1–4.n, for example, belong to the same group and are controlled collectively. When the output signals of buffers 23.1–3.n are provided to n DUTs, memory 64 provides a signal at "H (high)" level to each of AND gates 65 corresponding to switches 22, 24.1–4.n and couples tester bus control circuit 61 to each of switch drivers 66 corresponding to switches 22, 24.1–4.n. Tester bus control circuit 61 collectively controls switches 22, 24.1–4.n through n+1 switch drivers 66 in accordance with the control signal from controller 2. In the present modification, a plurality of switches are collectively controlled on/off, so that the control can be simplified and increased in speed as compared with the separate control of the switches.

[Fourth Modification]

Figure 9:
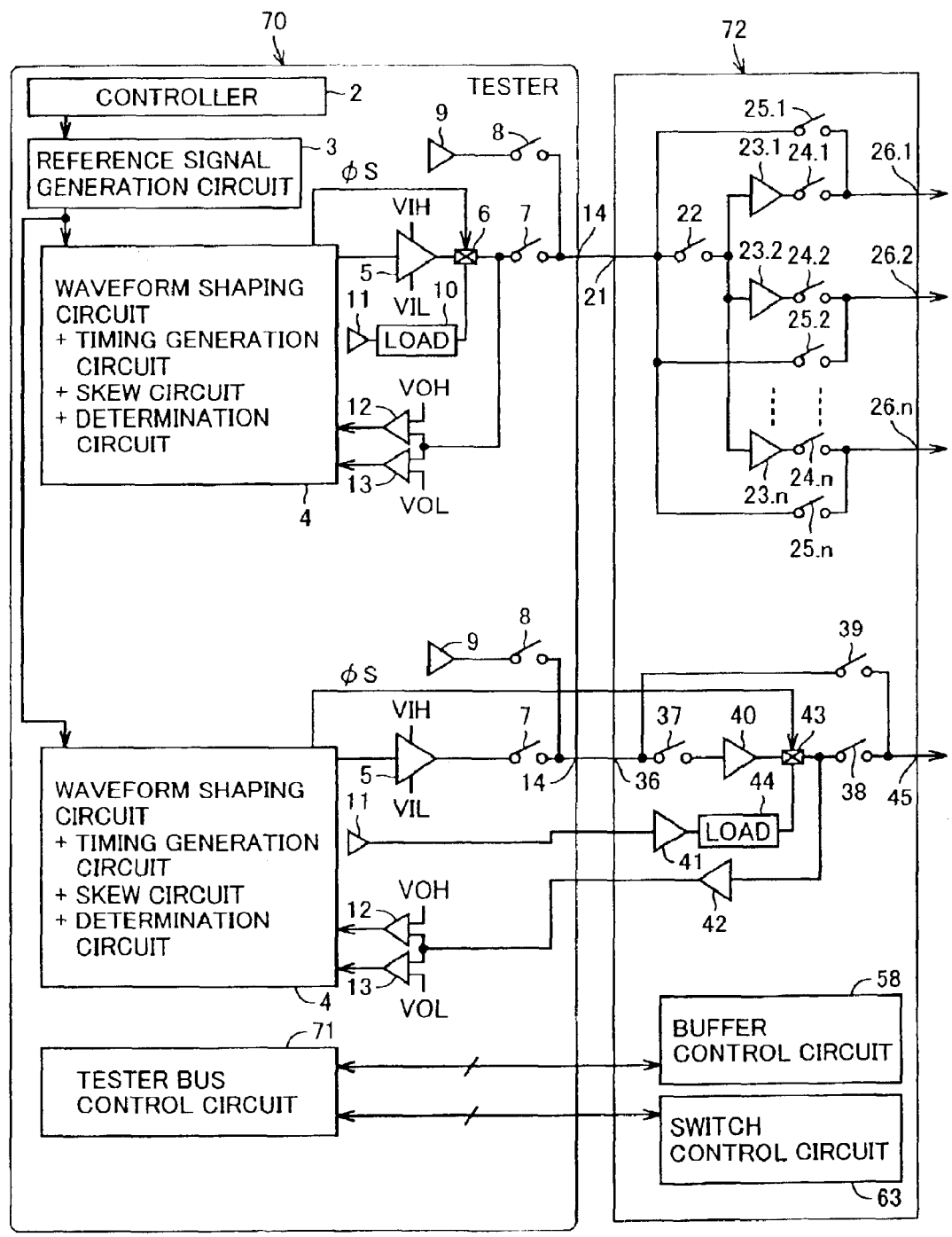
FIG. 9 is a circuit block diagram showing still another modification of the second embodiment.

The semiconductor test system in FIG. 9 includes a tester 70 and an interface circuit 72. Tester 70 is formed by adding a tester bus control circuit 71 to tester 50 in FIG. 5. Interface circuit 72 is formed by adding a buffer control circuit 58 and a switch control circuit 63 to interface circuit 51 in FIG. 5. Tester bus control circuit 71 has both of the functions of tester bus control circuit 56 in FIG. 6 and of tester bus control circuit 61 in FIG. 7. Therefore in the fourth modification, the effects of both the semiconductor test system in FIG. 6 and the semiconductor test system in FIG. 7 can result.

[Fifth Modification]

Figure 10:
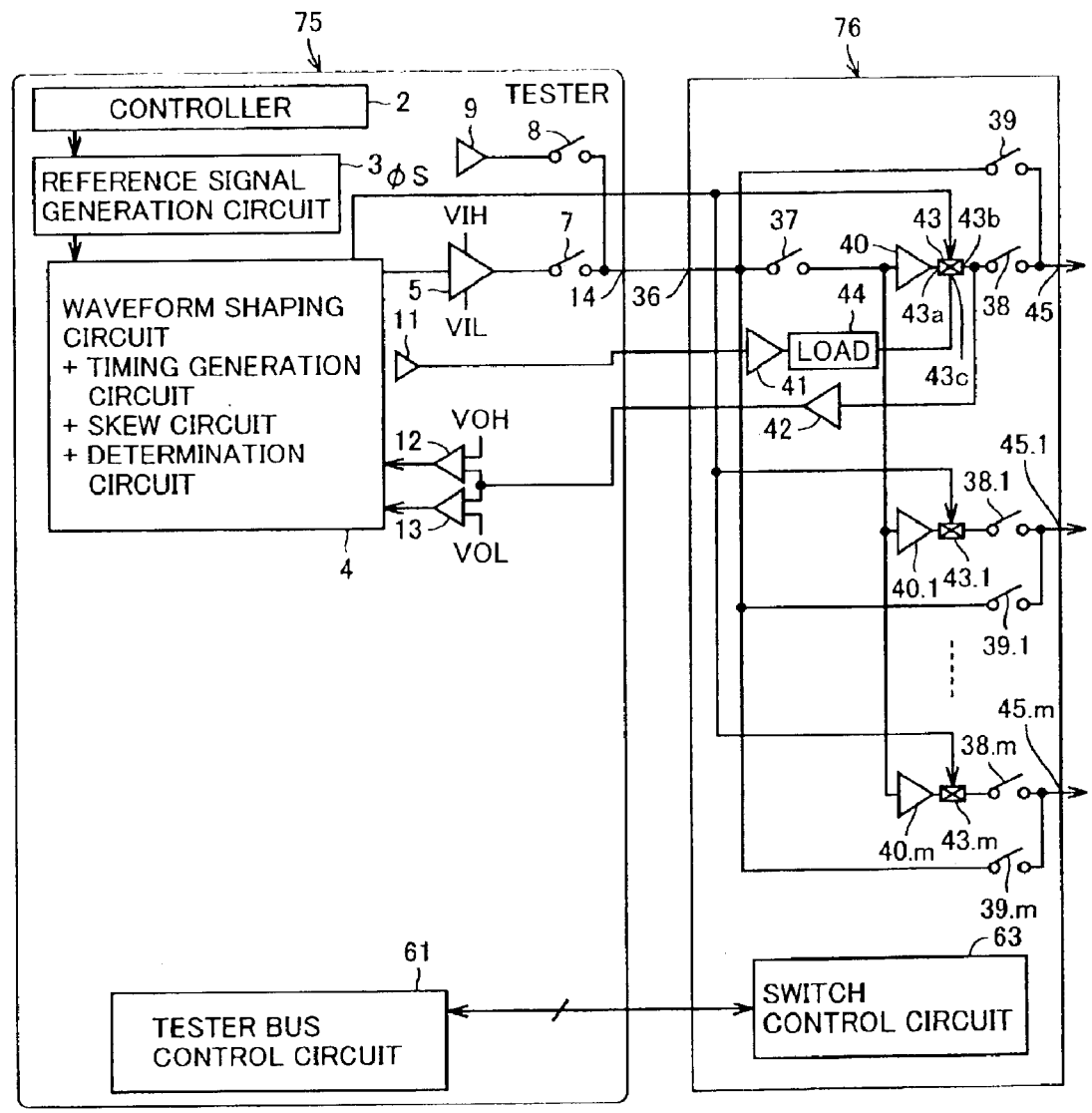
FIG. 10 is a circuit block diagram showing a further modification of the second embodiment.

The semiconductor test system in FIG. 10 includes a tester 75 and an interface circuit 76. Tester 75 is formed by adding a tester bus control circuit 61 to tester 30 in FIG. 2. Interface circuit 76 is formed by adding buffers 40.1–40.m (where m is a natural number), fast change-over switches 43.1–43.m, switches 38.1–38.m, 39.1–39.m, output terminals 45.1–45.m, and a switch control circuit 63 to interface circuit 35 in FIG. 2.

The input nodes of buffers 40.1–40.m are connected together to an input node of buffer 40. Each of fast change-over switches 43.1–43.m includes an input terminal and an output terminal. Fast change-over switches 43.1–43.m have their input terminals connected to respective output nodes of buffers 40.1–40.m, and their output terminals connected to respective one electrodes of switches 38.1–38.m. Fast change-over switches 43.1–43.m are controlled together by switching signal φS from test circuit 4 and are rendered conductive when a signal is provided from tester 75 to DUT. The voltage amplification rates of buffers 40.1–40.m are controllable.

Switches 38.1–38.m have their one electrodes connected to the respective output terminals of fast change-over switches 43.1–43.m, and their other electrodes connected to the respective output terminals 45.1–45.m. Switches 38.1–38.m are rendered conductive when a signal is output from tester 75 to DUT. Switches 39.1–39.m have their one electrodes connected together to input terminal 36 and their other electrodes connected to the respective output terminals 45.1–45.m. Switches 39.1–39.m are successively rendered conductive one by one when a voltage-ampere characteristic of DUT is measured. Tester bus control circuit 61 and switch control circuit 63 divide switches 37, 38, 38.1–38.m, 39, 39.1–39.m into a plurality of groups and control on/off of switches 37, 38, 38.1–38.m, 39, 39.1–39.m on a group-by-group basis.

The operation of this semiconductor test system will now be described. When a signal is applied from tester 75 to DUT, switch 7 is rendered conductive and switch 8 is rendered non-conductive in tester 75, and switches 37, 38, 38.1–38.m are rendered conductive, switches 39, 39.1–39.m are rendered non-conductive, fast change-over switch is rendered conductive between switch terminals 43a and 43b, and each of fast change-over switches 43.1–43.m is rendered conductive between the input terminal and the output terminal, in interface circuit 76. The output signal of tester 75 is amplified by buffers 40, 40.1–40.m and is applied to m+1 DUT terminals through output terminals 45, 45.1–45.m.

When tester 75 receives the output signal of DUT, switches 7, 8 are rendered non-conductive in tester 75. Furthermore, in interface circuit 76, switches 37, 38.1–38.m, 39, 39.1–39.m are rendered non-conductive, switch 8 is rendered conductive, and fast switch 43 is rendered conductive between switch terminals 43b and 43c. The output signal of DUT is provided to comparators 12, 13 through signal input/output terminal 45, switch 38 and buffer 42.

When the voltage-ampere characteristic of DUT is measured, in tester 75, switch 7 is rendered non-conductive and switch 8 is rendered conductive. Furthermore, in interface circuit 76, switches 37, 38.1–38.m are rendered non-conductive and switches 39, 39.1–39.m are rendered conductive one by one by a prescribed time period. Current measuring unit 9 measures the voltage-ampere characteristic of DUT through a conducting switch of switches 39, 39.1–39.m.

In the fifth modification, the same effect as in the first and second embodiments and the third modification can result.

It is noted that actually tester 75 includes a plurality of external pins 14 and interface circuit 76 includes plural sets of switches 37, 38.1–38.m, 39, 39.1–39.m, buffers 40, 40.1–40.m, 41, 42, fast change-over switches 43, 43.1–43.m, and load circuit 44. Interface circuit 76 may be formed on one semiconductor substrate (chip) or may be mounted on a normal insulating substrate (a substrate for testing a device, a probe card, a substrate within a tester, or the like). Alternatively, interface circuit 76 may be provided within tester 75. Furthermore, a plurality of DUTs may be mounted on one test substrate and interface circuit 76 may also be mounted on the test substrate.

[Sixth Modification]

Figure 11:
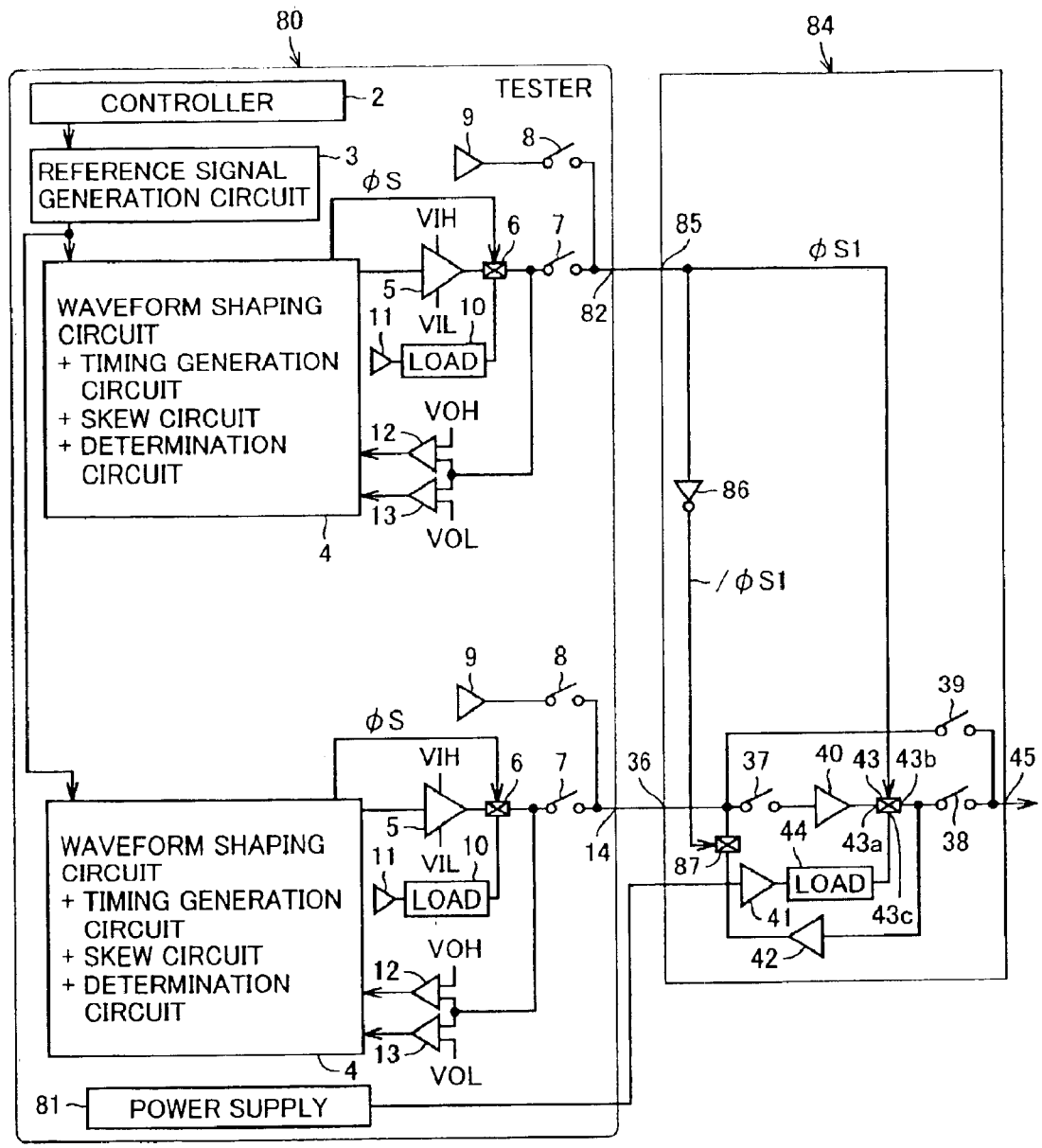
FIG. 11 is a circuit block diagram showing a further modification of the second embodiment.

The semiconductor test system in FIG. 11 includes a tester 80 and an interface circuit 84. Tester 80 is formed by adding test circuit 4, output buffer 5, fast change-over switch 6, switches 7, 8, current measuring unit 9, load circuit 10, power supplies for load circuit 11, 81, comparators 12, 13, and an external pin 82, to tester 1 in FIG. 1. The output signal of the added test circuit 4 is provided to external pin 82 through the added output buffer 5, fast change-over switch 6 and switch 7. The signal appearing on external pin 82 is used in interface circuit 84 as switching signal φS1. The output voltage of power supply for load circuit 81 is directly applied to interface circuit 84.

Interface circuit 84 is formed by adding an input terminal 85, an inverter 86 and a fast change-over switch 87 to interface circuit 35 in FIG. 2. Input terminal 85 is connected to external pin 82 of tester 80. Switching signal φS1 is inverted by inverter 86 to be a signal/φS1. Fast change-over switch 87 includes an input terminal and an output terminal. Fast change-over switch 87 has its input terminal receiving the output signal of buffer 42 and its output terminal connected to signal input/output terminal 36. Fast change-over switch 87 is controlled by signal/φS1 and is rendered conductive between its input terminal and output terminal when tester 80 receives the output signal of DUT. Fast change-over switch 43 is controlled by switching signal φS1.

The operation of this semiconductor test system will now be described. When a signal of tester 80 is applied to DUT, in interface circuit 84, switches 37, 38 are rendered conductive, switch 39 is rendered non-conductive, fast change-over switch 43 is rendered conductive between switch terminals 43a and 43b, and fast change-over switch 87 is rendered conductive between the input terminal and the output terminal. The output signal of tester 80 is provided to the data input/output terminal of DUT through external pin 14, terminal 36, switch 37, buffer 40, fast change-over switch 43, switch 38, and signal input/output terminal 45.

When tester 80 receives the output signal of DUT, in interface circuit 84, switches 37, 39 are rendered non-conductive, switch 38 is rendered conductive, fast change-over switch 43 is rendered conductive between switch terminals 43b and 43c, and fast change-over switch 87 is rendered conductive between the input terminal and the output terminal. The output signal of DUT is provided to tester 80 through signal input/output terminal 45, switch 38, buffer 42, fast change-over switch 87, signal input/output terminal 36, and external pin 14.

When the voltage-ampere characteristic of DUT is measured, in interface circuit 84, switches 37, 38 are rendered non-conductive, switch 39 is rendered conductive, and fast change-over switch 87 is rendered non-conductive between the input terminal and the output terminal. As a result, external pin 14 of tester 80 is directly connected to the signal terminal of DUT not through buffers 40-42, and the voltage-ampere characteristic of DUT is measured by current measuring unit 9.

In the sixth modification, the same effect as in the second embodiment can result with less modification of the tester.

[Seventh Modification]

Figure 12:
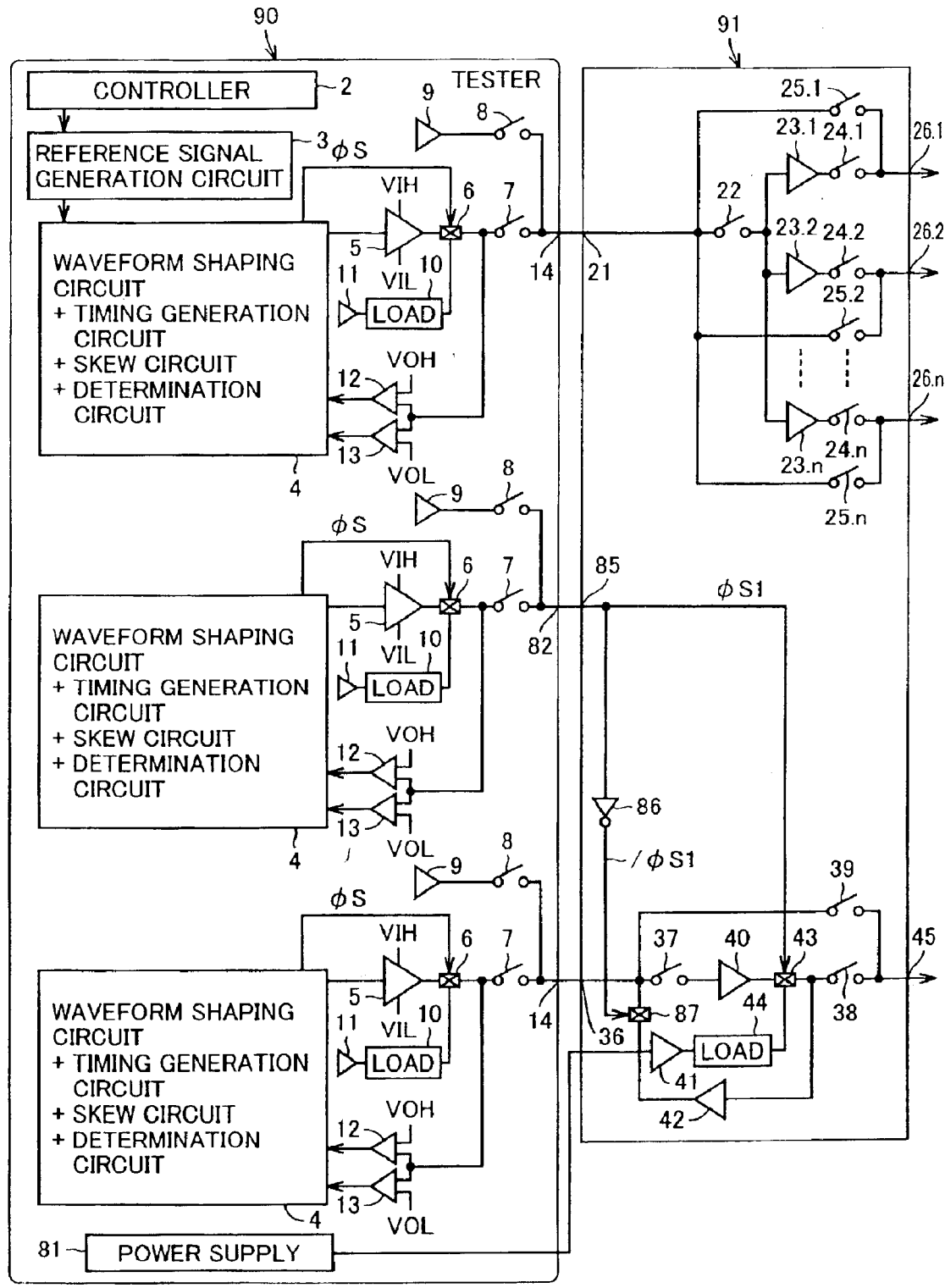
FIG. 12 is a circuit block diagram showing a further modification of the second embodiment.

The semiconductor test system in FIG. 12 includes a tester 90 and an interface circuit 91. Tester 90 is formed by combining tester 1 in FIG. 1 with tester 80 in FIG. 11. Interface circuit 91 is formed by combining interface circuit 20 in FIG. 1 with interface circuit 84 in FIG. 11. In the seventh modification, the effects of both the first embodiment and the sixth modification can result.

[Eighth Modification]

Figure 13:
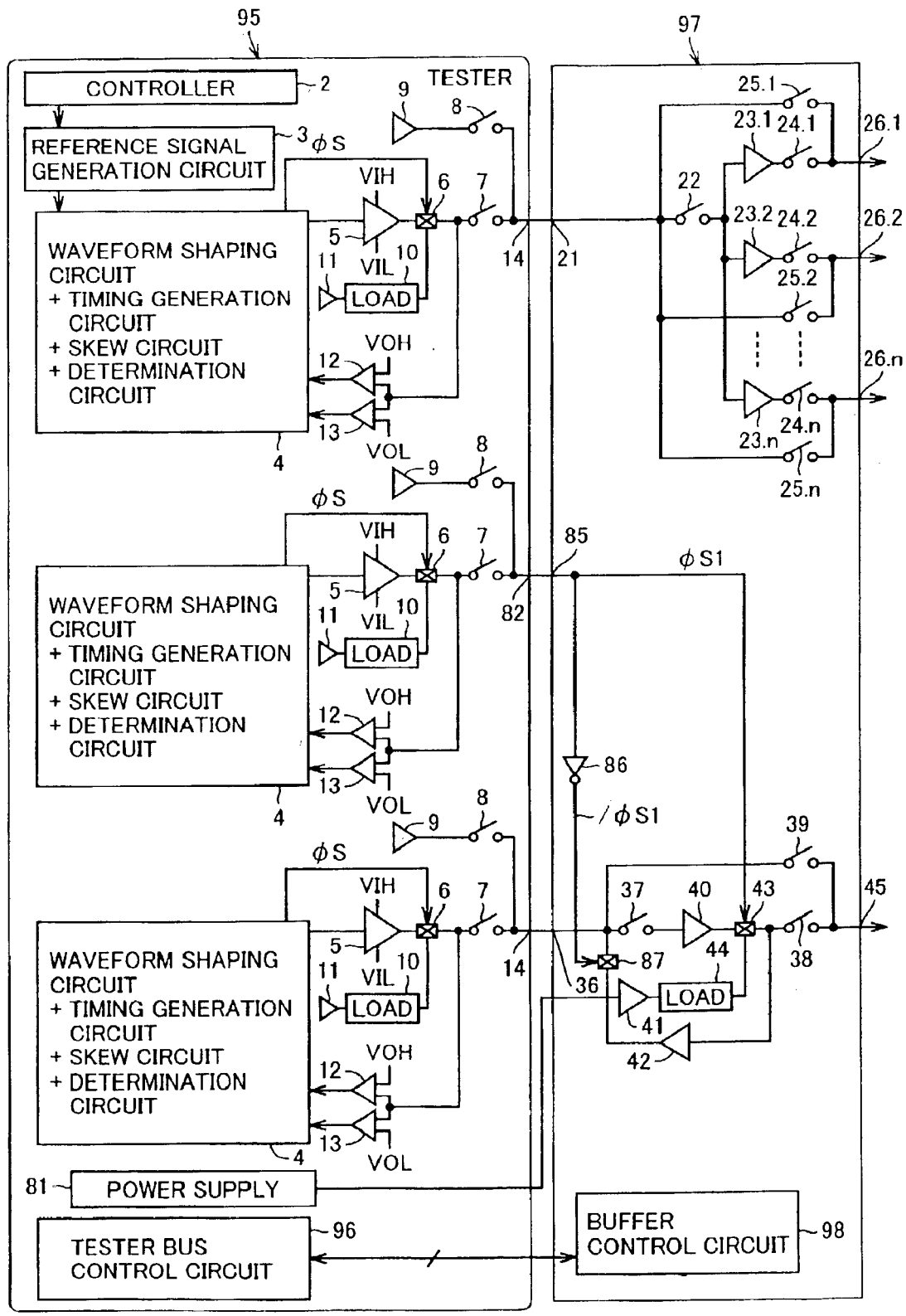
FIG. 13 is a circuit block diagram showing a further modification of the second embodiment.

The semiconductor test system in FIG. 13 includes a tester 95 and an interface circuit 97. Tester 95 is formed by adding a tester bus control circuit 96 to tester 90 in FIG. 12. Interface circuit 97 is formed by adding a buffer control circuit 98 to interface circuit 91 in FIG. 12. Tester bus control circuit 96 and buffer control circuit 98 control the voltage amplification rates of buffers 23.1–3.n, 41–43 of interface circuit 97, separately. Therefore the voltage amplification rates of buffers 23.1–3.n, 41–43 can be changed separately depending on a test item within a sequence of a test program.

[Ninth Modification]

Figure 14:
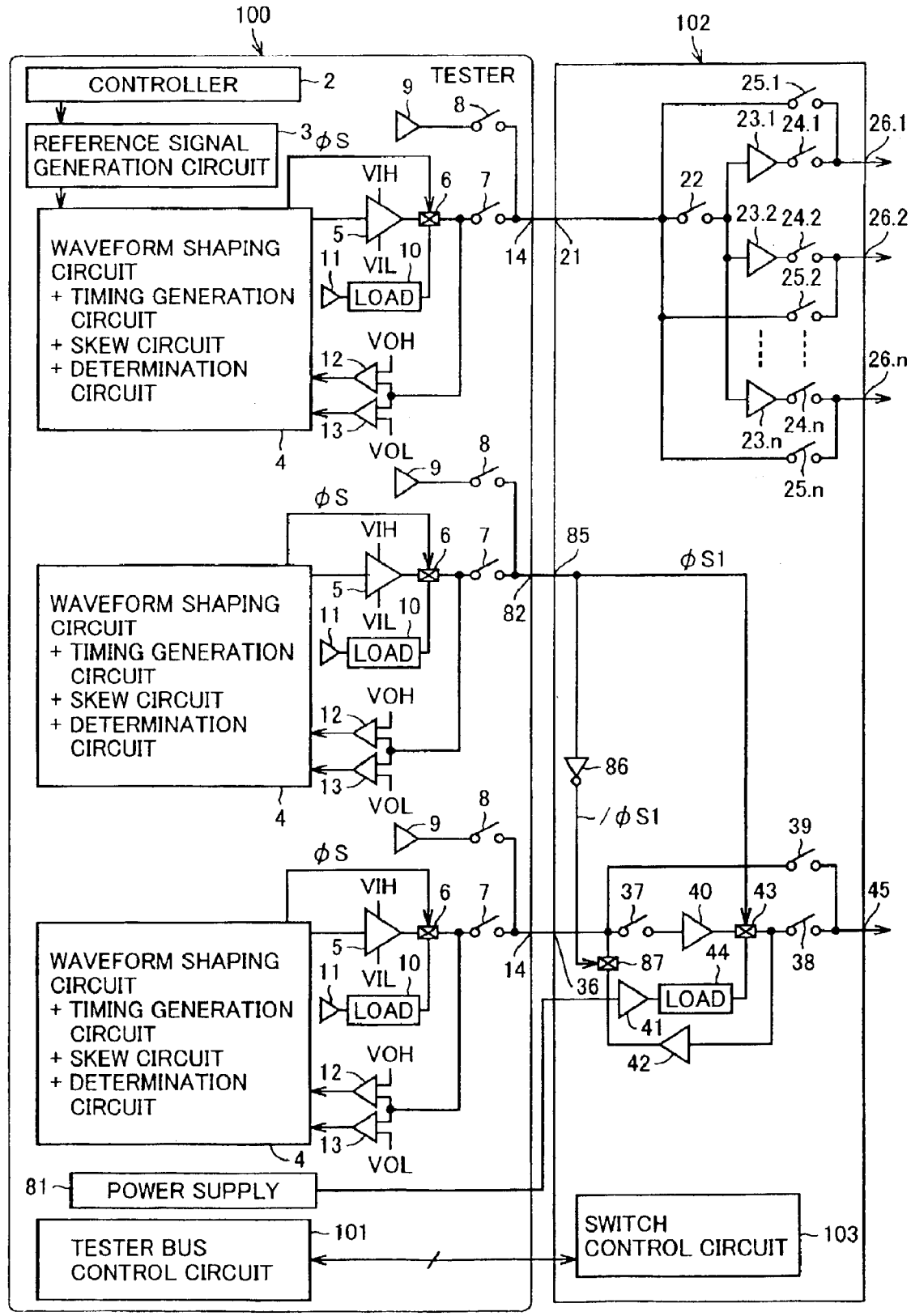
FIG. 14 is a circuit block diagram showing a further modification of the second embodiment.

The semiconductor test system in FIG. 14 includes a tester 100 and an interface circuit 102. Tester 100 is formed by adding a tester bus control circuit 101 to tester 90 in FIG. 12. Interface circuit 102 is formed by adding a switch control circuit 103 to interface circuit 91 in FIG. 12. Tester bus control circuit 101 and switch control circuit 103 divide switches 26.1–6.n, 37–39 into a plurality of groups and collectively control switches 26.1–6.n, 37–39 on a group-by-group basis. Therefore the switch control can be simplified and increased in speed as compared with the separate control of the switches.

[Tenth Modification]

Figure 15:
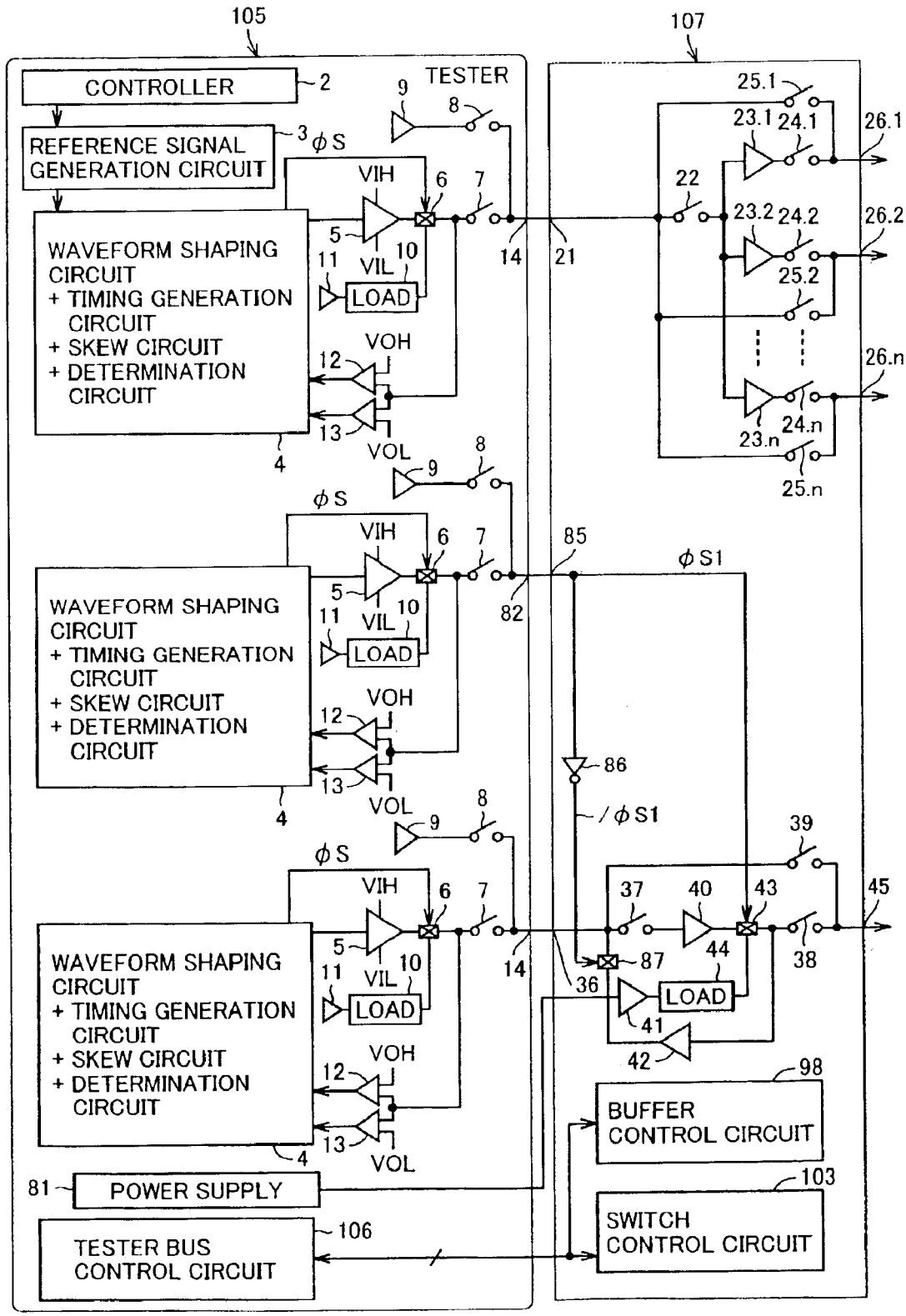
FIG. 15 is a circuit block diagram showing a further modification of the second embodiment.

The semiconductor test system in FIG. 15 includes a tester 105 and an interface circuit 107. Tester 105 is formed by adding a tester bus control circuit 106 to tester 90 in FIG. 12. Interface circuit 107 is formed by adding buffer control circuit 98 and switch control circuit 103 to interface circuit 91 in FIG. 12. Tester bus control circuit 106 has the functions of both tester bus control circuit 96 in FIG. 13 and tester bus control circuit 101 in FIG. 14. Therefore in the tenth modification, the effects of both the eighth and ninth modifications can result.

[Eleventh Modification]

Figure 16:
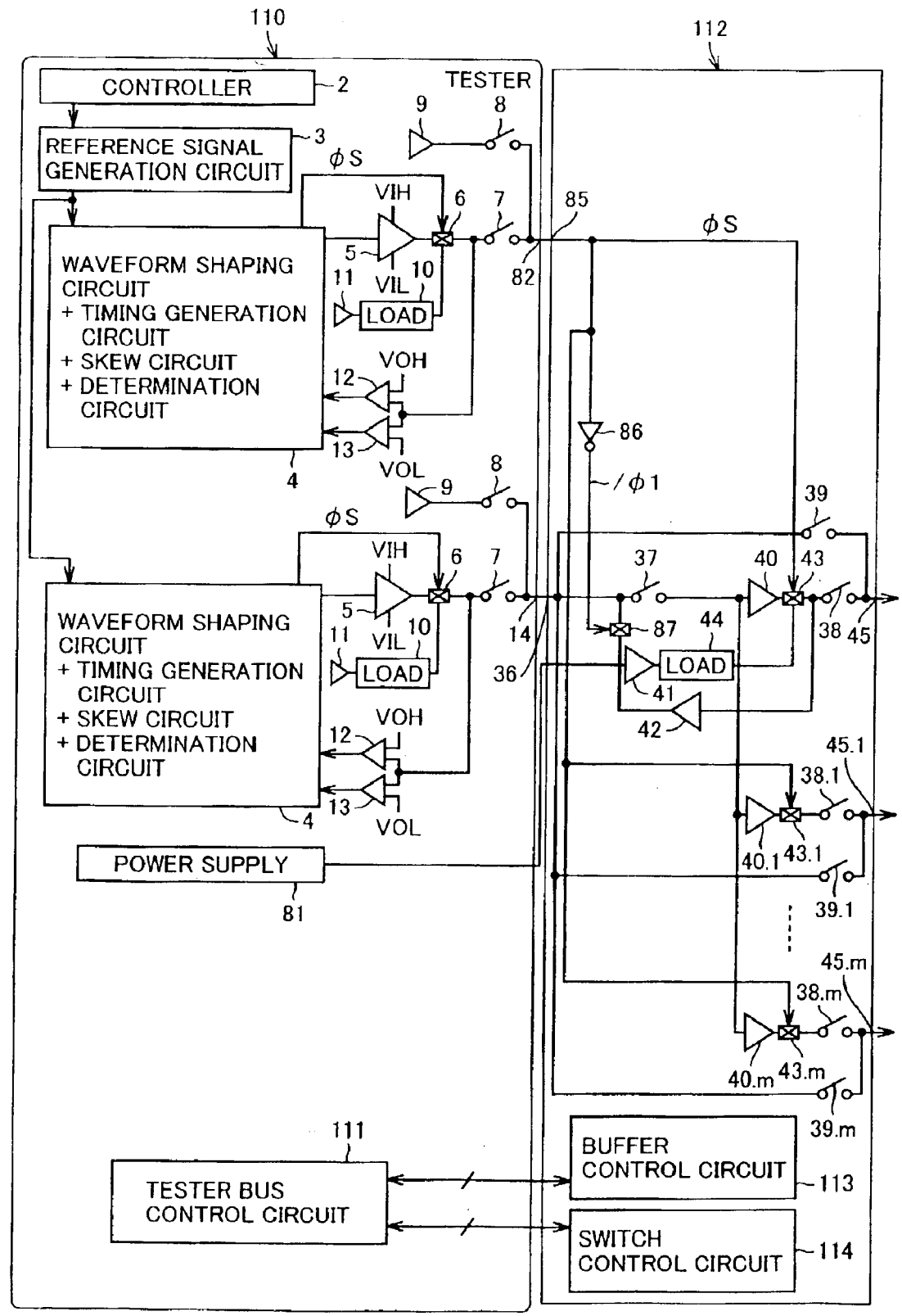
FIG. 16 is a circuit block diagram showing a further modification of the second embodiment.

The semiconductor test system in FIG. 16 includes a tester 110 and an interface circuit 112. Tester 110 is formed by adding a tester bus control circuit 111 to tester 80 in FIG. 11. Interface circuit 112 is formed by adding a buffer control circuit 113 and a switch control circuit 114 as well as buffers 40.1–40.n, fast change-over switches 43.1–43.m, switches 38.1–38.m, 39.1–39.m and output terminals 45.1–45.m in FIG. 10, to interface circuit 85 in FIG. 11. Therefore in the eleventh modification the effects of the fifth, sixth and tenth modifications can result.

It is noted that although in the first and second embodiments and the first to eleventh modifications as described above, the voltage amplification rate of the buffer is variable, the voltage amplification rate of the buffer may be fixed at a constant value.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An interface circuit coupling a semiconductor test apparatus to a plurality of tested semiconductor devices, comprising a plurality of buffer circuits provided respectively corresponding to said plurality of tested semiconductor devices and having their input nodes connected to each other, each of said buffer circuits transmitting an output signal of said semiconductor test apparatus to a corresponding tested semiconductor device, wherein each of voltage amplification rates of said plurality of buffer circuits is controllable.

2. The interface circuit according to claim 1, further comprising a buffer control circuit controlling each of voltage amplification rates of said plurality of buffer circuits in accordance with a first control signal from said semiconductor test apparatus.

3. The interface circuit according to claim 1, wherein said semiconductor test apparatus includes a signal generation circuit generating a signal to be provided to said plurality of tested semiconductor devices through said plurality of buffer circuits, a measurement circuit measuring a voltage-ampere characteristic of each tested semiconductor device, a test terminal, and a switching circuit coupling said signal generation circuit to said test terminal at a first mode and coupling said measurement circuit to said test terminal at a second mode, said interface circuit further comprising:

a first switching element having its one electrode connected to said test terminal and its other terminal connected to the input nodes of said plurality of buffer circuits, and being rendered conductive at said first mode;

a plurality of second switching elements having their one electrodes respectively connected to output nodes of said plurality of buffer circuits and their other electrodes respectively connected to said plurality of tested semiconductor devices, and being rendered conductive at said first mode; and a plurality of third switching elements having their one electrodes connected together to said test terminal and their other electrodes respectively connected to said plurality of tested semiconductor devices, and being successively rendered conductive by a prescribed time period at said second mode.

4. The interface circuit according to claim 3, wherein said first switching element, said plurality of second switching elements and said plurality of third switching elements are divided into a plurality of groups in advance, said interface circuit further comprising a switch control circuit controlling said first switching element, said piurality of second switching elements and said plurality of third switching elements on a group-by-group basis in accordance with a second control signal from said semiconductor test apparatus.

5. The interface circuit according to claim 3, wherein said semiconductor test apparatus includes plural sets of said signal generation circuit, said measurement circuit, said test terminal, and said switching circuit, a plurality of interface circuits are provided respectively corresponding to said plural sets, and said plurality of interface circuits are formed on one semiconductor or insulating substrate.

6. The interface circuit according to claim 1, wherein each of said plurality of buffer circuits transmits the output signal of said semiconductor test apparatus only to a single corresponding tested semiconductor device.

7. An interface circuit coupling a semiconductor test apparatus to a first tested semiconductor device, comprising:

a first buffer circuit having its input node receiving an output signal of said semiconductor test apparatus;

a load circuit suppressing a reflection of a signal output from said first tested semiconductor device;

a first switching circuit having a first switch terminal receiving an output signal of said first buffer circuit, a second switch terminal connected to said first tested semiconductor device and a third switch terminal connected to said load circuit, being rendered conductive between said first and second switch terminals at a first mode in which an output signal of said semiconductor test apparatus is applied to said first tested semiconductor device, and being rendered conductive between said second and third switch terminals at a second mode in which an output signal of said first tested semiconductor device is applied to said semiconductor test apparatus; and a second buffer circuit having its input node connected to said second switch terminal and transmitting an output signal of said first tested semiconductor device to said semiconductor test apparatus at said second mode.

8. The interface circuit according to claim 7, wherein said semiconductor test apparatus includes a first signal generation circuit generating a signal to be applied to said first tested semiconductor device through said first buffer circuit and said first switching circuit, a measurement circuit measuring a voltage-ampere characteristic of said first tested semiconductor device, a first test terminal, a second switching circuit coupling said first signal generation circuit to said first test terminal at said first mode and coupling said measurement circuit to said first test terminal at a third mode, and a determination circuit determining a logic level of an output signal of said first tested semiconductor device based on an output signal of said second buffer circuit, said interface circuit further comprising:

a first switching element having its one electrode connected to said first test terminal and its other electrode connected to the input node of said first buffer circuit, and being rendered conductive at said first mode;

a second switching element having its one electrode connected to the second switch terminal of said first switching circuit and its other electrode connected to said first tested semiconductor device, and being rendered conductive at said first mode; and a third switching element having its one electrode connected to said first test terminal and its other electrode connected to said first tested semiconductor device, and being rendered conductive at said third mode.

9. The interface circuit according to claim 8, further comprising a third switching circuit having an input terminal connected to an output node of said second buffer circuit and an output terminal connected to said first test terminal, and being rendered conductive between said input terminal and said output terminal at said second mode, wherein said second switching circuit couples said determination circuit to said first test terminal at said second mode.

10. The interface circuit according to claim 9, wherein said semiconductor test apparatus further includes a second test terminal; and a second signal generation circuit generating and providing to said second test terminal a switching signal controlling said first and third switching circuits, said interface circuit further comprising an inverter generating an inverted signal of said switching signal, wherein one of said first and third switching circuits is controlled by said switching signal and the other is controlled by said inverted signal of the switching signal.

11. The interface circuit according to claim 8, wherein said semiconductor test apparatus includes plural sets of said first signal generation circuit, said measurement circuit, said first test terminal, said second switching circuit, and said determination circuit, a plurality of interface circuits are provided respectively corresponding to said plural sets, and said plurality of interface circuits are formed on one semiconductor or insulating substrate.

12. The interface circuit according to claim 8, wherein said interface circuit further couples said semiconductor test apparatus to a plurality of second tested semiconductor devices, and said measurement circuit also measures a voltage-ampere characteristic of each second tested semiconductor device, said interface circuit further comprising:

a plurality of third buffer circuits provided respectively corresponding to said plurality of second tested semiconductor devices and having their input nodes connected together to said first buffer circuit;

a plurality of fourth switching elements having their one electrodes respectively connected to output nodes of said plurality of third buffer circuits and their other electrodes respectively connected to said plurality of tested semiconductor devices, and being rendered conductive at said first mode; and a plurality of fifth switching elements having their one electrodes connected together to said first test terminal and their other electrodes respectively connected to said plurality of second tested semiconductor devices, and being rendered conductive successively by a prescribed time period at a fourth mode in which a voltage-ampere characteristic of each of said plurality of second tested semiconductor devices is measured.

13. The interface circuit according to claim 12, wherein each of voltage-amplification rates of said first buffer circuit, said second buffer circuit and said plurality of third buffer circuits is controllable.

14. The interface circuit according to claim 13, further comprising a buffer control circuit controlling each of voltage amplification rates of said first buffer circuit, said second buffer circuit and said plurality of third buffer circuits in accordance with a first control signal from said semiconductor test apparatus.

15. The interface circuit according to claim 12, wherein said first to third switching elements, said plurality of fourth switching elements and said plurality of fifth switching elements are divided into a plurality of groups in advance, said interface circuit further comprising a switch control circuit controlling said first to third switching elements, said plurality of fourth switching elements, and said plurality of fifth switching elements on a group-by-group basis in accordance with a second control signal from said semiconductor test apparatus.

16. The interface circuit according to claim 7, wherein each of voltage amplification rates of said first and second buffer circuits is controllable.

17. The interface circuit according to claim 16, further comprising a buffer control circuit controlling each of voltage amplification rates of said first and second buffer circuits in accordance with a control signal from said semiconductor test apparatus.

* * * * *